(12) United States Patent
Fujikura

(10) Patent No.: US 7,663,138 B2
(45) Date of Patent: Feb. 16, 2010

(54) NITRIDE SEMICONDUCTOR LIGHT EMITTING ELEMENT

(75) Inventor: Hajime Fujikura, Tsukuba (JP)

(73) Assignee: Hitachi Cable, Ltd., Chiyoda-ku, Tokyo (JP)

( * ) Notice: Subject to any disclaimer, the term of this patent is extended or adjusted under 35 U.S.C. 154(b) by 0 days.

(21) Appl. No.: 11/717,052

(22) Filed: Mar. 13, 2007

(65) Prior Publication Data

US 2007/0262293 A1    Nov. 15, 2007

(30) Foreign Application Priority Data

May 12, 2006   (JP) ............................... 2006-133809

(51) Int. Cl.
H01L 29/06   (2006.01)
H01L 21/3205   (2006.01)
H01S 5/00   (2006.01)

(52) U.S. Cl. ............... 257/9; 372/43.01; 372/45.01; 372/45.011; 372/45.012; 372/46.012; 372/50; 257/12; 257/13; 257/14; 257/15; 257/17; 257/23; 257/94; 257/96; 257/97; 257/101; 257/102; 257/103; 257/E33.013; 257/E33.014; 257/E33.023; 257/E33.025; 257/E22.028; 257/E33.034; 438/46; 438/47

(58) Field of Classification Search ............. 372/43.01, 372/45.01, 45.011, 45.012, 46.012, 50.1; 257/94, 96, 97, 101–103, 9, 12, 13, 14, 15, 257/17, 23, E33.013, E33.014, E33.02, E33.021, 257/E33.022, E33.023, E33.024, E33.025, 257/E33.026, E33.027, E33.028, E33.034; 438/46, 47

See application file for complete search history.

(56) References Cited

U.S. PATENT DOCUMENTS

| | | | | | |
|---|---|---|---|---|---|
| 5,202,897 | A | * | 4/1993 | Whitehead | 372/92 |
| 5,740,192 | A | * | 4/1998 | Hatano et al. | 372/45.01 |
| 5,815,522 | A | * | 9/1998 | Nagai | 372/46.016 |
| 5,949,561 | A | * | 9/1999 | Goossen et al. | 398/79 |
| 5,998,810 | A | * | 12/1999 | Hatano et al. | 257/102 |

(Continued)

FOREIGN PATENT DOCUMENTS

CN    1619852    5/2005

(Continued)

OTHER PUBLICATIONS

English translation of Akasaka by a Machine through the JPO website.*
Chinese Office Action dated May 9, 2008 with English translation.

Primary Examiner—Wael Fahmy
Assistant Examiner—Hrayr A. Sayadian
(74) Attorney, Agent, or Firm—McGinn IP Law Group, PLLC

(57) ABSTRACT

A n-type layer, a multiquantum well active layer comprising a plurality of pairs of an InGaN well layer/InGaN barrier layer, and a p-type layer are laminated on a substrate to provide a nitride semiconductor light emitting element. A composition of the InGaN barrier included in the multiquantum well active layer is expressed by $In_xGa_{1-x}N$ ($0.04 \leq x \leq 0.1$), and a total thickness of InGaN layers comprising an In composition ratio within a range of 0.04 to 0.1 in the light emitting element including the InGaN barrier layers is not greater than 60 nm.

16 Claims, 6 Drawing Sheets

U.S. PATENT DOCUMENTS

| | | | |
|---|---|---|---|
| 6,108,360 A * | 8/2000 | Razeghi | 372/45.012 |
| 6,169,296 B1 * | 1/2001 | Kamiyama et al. | 257/94 |
| 6,191,437 B1 * | 2/2001 | Sonobe et al. | 257/94 |
| 6,242,761 B1 * | 6/2001 | Fujimoto et al. | 257/94 |
| 6,271,943 B1 * | 8/2001 | Goossen | 398/9 |
| 6,344,375 B1 * | 2/2002 | Orita et al. | 438/151 |
| 6,475,923 B1 * | 11/2002 | Mitamura | 438/758 |
| 6,493,367 B1 * | 12/2002 | Ito et al. | 372/45.01 |
| 6,555,403 B1 * | 4/2003 | Domen et al. | 438/22 |
| 6,556,603 B1 * | 4/2003 | Yamasaki et al. | 372/45.01 |
| 6,606,335 B1 * | 8/2003 | Kuramata et al. | 372/45.01 |
| 6,627,552 B1 * | 9/2003 | Nishio et al. | 438/694 |
| 6,645,885 B2 * | 11/2003 | Chua et al. | 438/509 |
| 6,667,498 B2 * | 12/2003 | Makimoto et al. | 257/183 |
| 6,670,647 B1 * | 12/2003 | Yamasaki et al. | 257/99 |
| 6,956,232 B2 * | 10/2005 | Reynolds | 257/14 |
| 7,177,336 B2 * | 2/2007 | Taneya et al. | 372/64 |
| 7,375,367 B2 | 5/2008 | Hooper et al. | |
| 2001/0030318 A1 * | 10/2001 | Nakamura et al. | 257/13 |
| 2002/0001864 A1 * | 1/2002 | Ishikawa et al. | 438/22 |
| 2002/0150136 A1 * | 10/2002 | Watanabe et al. | 372/46 |
| 2002/0171092 A1 * | 11/2002 | Goetz et al. | 257/103 |
| 2002/0195619 A1 * | 12/2002 | Makimoto et al. | 257/197 |
| 2003/0020085 A1 * | 1/2003 | Bour et al. | 257/101 |
| 2003/0151043 A1 * | 8/2003 | Kawanishi et al. | 257/13 |
| 2003/0209714 A1 * | 11/2003 | Taskar et al. | 257/79 |
| 2003/0209722 A1 * | 11/2003 | Hatakoshi et al. | 257/98 |
| 2004/0023427 A1 * | 2/2004 | Chua et al. | 438/47 |
| 2004/0056259 A1 * | 3/2004 | Goto et al. | 257/79 |
| 2004/0101986 A1 * | 5/2004 | Kozaki et al. | 438/22 |
| 2004/0104398 A1 * | 6/2004 | Hon et al. | 257/98 |
| 2004/0252739 A1 * | 12/2004 | Takeuchi et al. | 372/46 |
| 2005/0092979 A1 * | 5/2005 | Han et al. | 257/9 |
| 2005/0116215 A1 | 6/2005 | Hooper et al. | |
| 2005/0224781 A1 * | 10/2005 | Kneissl et al. | 257/14 |
| 2005/0263780 A1 * | 12/2005 | Bour et al. | 257/94 |
| 2007/0014323 A1 * | 1/2007 | Tachibana et al. | 372/46.01 |
| 2008/0048172 A1 * | 2/2008 | Muraki et al. | 257/13 |

FOREIGN PATENT DOCUMENTS

| | | | |
|---|---|---|---|
| JP | 02234486 A | * | 9/1990 |
| JP | 3135041 | | 12/2000 |
| JP | 2002-76521 | | 3/2002 |
| JP | 2002076521 A | * | 3/2002 |

* cited by examiner

102 LIGHT EMITTING ELEMENT
8 TRANSPARENT CONDUCTIVE FILM
9 p-ELECTRODE
7 p-GaN LAYER
6 p−$Al_{0.1}Ga_{0.9}N$ LAYER
5 $In_aGa_{1-a}N/In_bGa_{1-b}N$ MQW
10 n-ELECTRODE
17 UNDOPED $In_bGa_{1-b}N$ LAYER
4 n-GaN LAYER
21 GaN SUBSTRATE

NITRIDE SEMICONDUCTOR LIGHT EMITTING ELEMENT

The present application is based on Japanese patent application No. 2006-133809 filed May 12, 2006, the entire contents of which are incorporated herein by reference.

BACKGROUND OF THE INVENTION

1. Field of the Invention

This invention relates to a nitride semiconductor light emitting element which can function with a lower driving voltage than that of a conventional light emitting element without losing essential functions of the light emitting element.

2. Description of the Related Art

Nowadays, nitride semiconductors such as gallium nitride (GaN), nitriding indium gallium (InGaN), gallium nitride aluminum (AlGaN) come into the limelight as a material for a green-blue-near ultraviolet region light emitting element (LED).

FIG. 6 is a diagram showing a configuration example of a conventional nitride semiconductor light emitting element.

A light emitting element 200 comprises a sapphire substrate 201, a low-temperature grown GaN buffer layer 202, an undoped GaN layer 203, a n-GaN layer 204, a pair multiquantum well (MQW) 205 including pairs of $In_aGa_{1-a}N$ (well layer)/GaN (barrier layer), a p-$Al_{0.1}Ga_{0.9}N$ layer 206, and a p-GaN layer 207 sequentially grown on the sapphire substrate 201. A surface of the p-GaN layer 207 to a part of the n-GaN layer 204 are etched by a reactive ion etching (RIE) apparatus, and a transparent conductive film 208 (Ni with a thickness of 2 nm/Au with a thickness of 4 nm) is deposited on the surface of the p-GaN layer 207 which is not etched by the RIE. Further, a p-electrode 209 is formed on a region of the p-GaN layer 207 which partially overlaps the transparent conductive film 208, and a n-electrode 210 is formed on the surface of the n-GaN layer 204 which is etched by RIE.

For example, for the case of a blue light emitting element with a peak wavelength of 460 nm, the pair multiquantum well 205 comprising pairs of the $In_aGa_{1-a}N$ well layer/GaN barrier layer has an In composition ratio a is 0.15, and is formed at a growth temperature of 780° C. On the other hand, for the case of a green light emitting element with a peak wavelength of 525 nm, the pair multiquantum well 205 comprising pairs of the $In_aGa_{1-a}N$ well layer/GaN barrier layer has an In composition ratio a of 0.25 and is formed at a growth temperature of 730° C.

In the conventional blue or green nitride semiconductor light emitting element, it was necessary for applying a voltage not less than 3V to flow an electric current with a current density of 20 A/cm². This voltage value is the value which is remarkably large in comparison with energy of the emission light (2.7 eV when the peak wavelength of the emission light is 525 nm for the case of the green light emitting element, and 2.36 eV when the peak wavelength of the emission light is assumed 460 nm for the case of the blue light emitting element). Such a difference in energy generates heat inside the semiconductor and raises a temperature in operation of the nitride semiconductor light emitting element, thereby causing fall of output power, fall of lifetime of the light emitting element, degradation of a sealing resin or the like.

The reason of the above effects is assumed as follows. In the conventional nitride semiconductor light emitting element, a GaN layer as shown in FIG. 6 or InGaN including a little of In (In composition ratio is not greater than 3%) is used as a barrier layer of the multiquantum well, so that a bandgap of the barrier layer increases more than 3V, and such a large bandgap disturbs dislocation of carrier in the barrier layer. In accordance with the above, it is assumed that it is effective to reduce the bandgap of the barrier layer, for example, by using the InGaN layer with the In composition ratio of not less than 4% as a barrier layer, so as to reduce a driving voltage of the nitride semiconductor light emitting element. Such a technique is disclosed by Japanese Patent No. 3135041 (JP-B-3135041, Embodiment 2, FIG. 1) and Japanese Patent Laid-Open No. 2002-76521 (JP-A-2002-76521, FIG. 1).

However, in the light emitting element disclosed by Japanese Patent No.3135041, since an In composition ratio of the barrier layer in the multiquantum well is 20%, lattice mismatch between a n-type GaN layer (a backing layer) and an active layer is increased, so that a new and further lattice defect is introduced into the active layer. As a result, the aforementioned light emitting element may not function as a light emitting element.

In addition, in the light emitting element disclosed by Japanese Patent Laid-Open No.2002-76521, since a light guide layer having a composition same as a barrier layer comprising $In_{0.05}Ga_{0.95}N$ is grown to have a thickness of 200 nm, crystal defect based on lattice mismatch is also introduced. As a result, there is a risk that a light emitting function of the light emitting element may be lost.

SUMMARY OF THE INVENTION

It is an object of the present invention to solve the above problems and to provide a nitride semiconductor light emitting element, in which a driving voltage required for an electric current with a current density of 20 A/cm² is less than 3V, to operate with a lower voltage compared with the conventional light emitting element without losing the essential function of the light emitting element.

For solving the above problems, the Inventor of the present invention contemplated and investigated zealously to realize a light emitting element which operates with a lower driving voltage without losing the essential function of the light emitting element, by using an InGaN barrier layer that has a greater In composition ratio than the conventional device. As a result of careful studies on a layer configuration of the light emitting element in total which comprises the multiquantum well in order to suppress the generation of lattice defect, the Inventor found following effects:

(1) The driving voltage of the light emitting element can be reduced by setting an In composition ratio of the InGaN barrier layer included in the multiquantum well active layer within a specific range; and (2) Introduction of new lattice defect can be prevented by setting a thickness of the InGaN barrier layer within a specific range and setting a total thickness of the InGaN layers having the In composition ratio in the specific range that is included in the InGaN barrier layer and the light emitting element to be less than a predetermined thickness.

The present invention is based on the aforementioned contemplation.

According to a first feature of the invention, a nitride semiconductor light emitting element comprises:

a substrate; and a n-type layer, a multiquantum well active layer comprising a plurality of pairs of an InGaN well layer/InGaN barrier layer, and a p-type layer laminated on the substrate;

wherein:

a composition of the InGaN barrier included in the multiquantum well active layer is expressed by $In_xGa_{1-x}N$ ($0.04 \leq x \leq 0.1$), and a total thickness of InGaN layers comprising an In composition ratio in a range of 0.04 to 0.1 in the light emitting element including the InGaN barrier layer is not greater than 60 nm.

In the nitride semiconductor light emitting element, an emission light peak wavelength of the multiquantum well active layer may be in a range of 430 to 560 nm.

In the nitride semiconductor light emitting element, it is preferable that a thickness of the InGaN barrier layer is in a range of 5 to 20 nm.

The nitride semiconductor light emitting element may further comprise:

an InGaN layer with an In composition ratio in a range of 0.04 to 0.1 that is interposed between the multiquantum well active layer and the n-type layer.

In the nitride semiconductor light emitting element, the multiquantum well active layer may be formed on a GaN layer or an $Al_yGa_{1-y}N$ layer (0<y<0.5) that is formed in lattice-relaxed states on the substrate.

In the nitride semiconductor light emitting element, the substrate may comprise a single crystal substrate comprising one material selected from a group consisting of sapphire, $Ga_2O_3$, SiC, Si, GaN, and AlN.

It is preferable to conduct a crystal growth of a layered structure constituting the nitride semiconductor light emitting element in a vapor growth apparatus. For example, it is preferable that the crystal growth is conducted in a Metal-Organic Vapor Phase Epitaxy (MOVPE) apparatus or a Hydride Vapor Phase Epitaxy (HVPE) apparatus.

According to the present invention, it is possible to provide a nitride semiconductor light emitting element, in which a voltage required for an electric current with a current density of 20 A/cm$^2$ is less than 3V, to operate with a lower voltage compared with the conventional light emitting element without losing the essential function of the light emitting element.

BRIEF DESCRIPTION OF THE DRAWINGS

Preferred embodiments according to the invention will be explained below referring to the drawings, wherein.

DETAILED DESCRIPTION OF THE PREFERRED EMBODIMENTS

Next, the preferred embodiments according to the present invention will be explained in more detail in conjunction with the appended drawings.

First Preferred Embodiment

Figure 1:
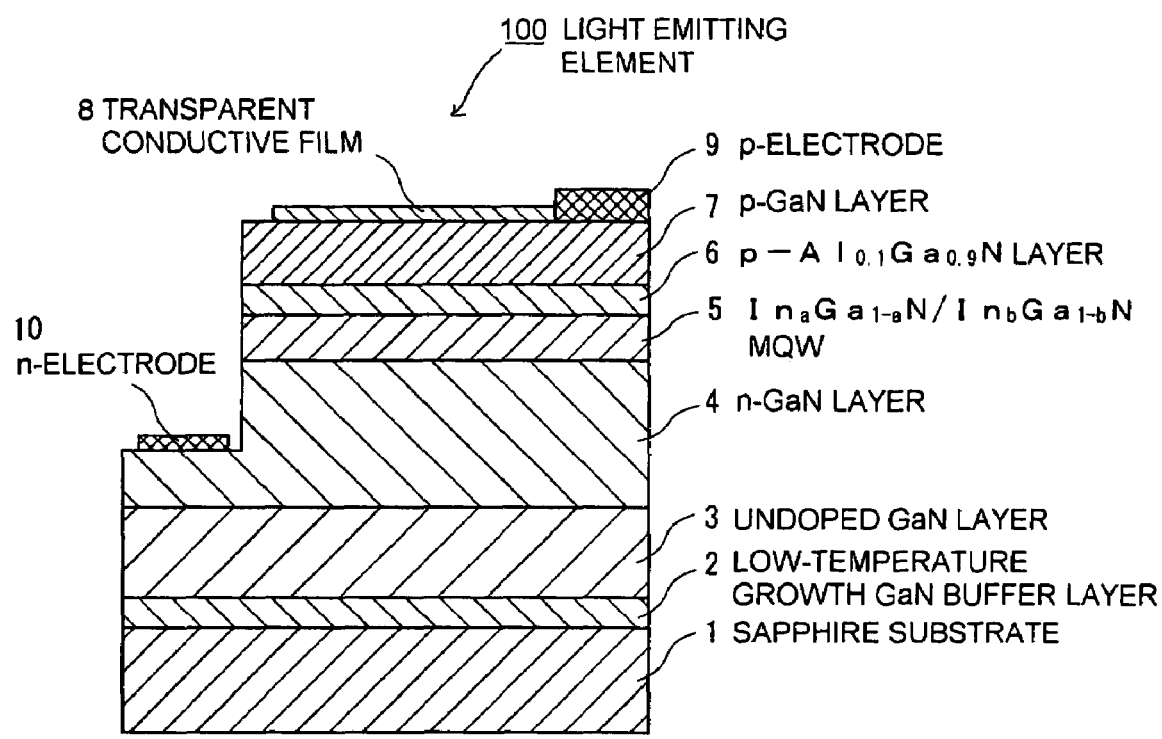
FIG. 1 is a schematic cross sectional view showing a configuration of a nitride semiconductor light emitting element in a first preferred embodiment according to the invention.

FIG. 1 is a schematic cross sectional view showing a structure of a nitride semiconductor light emitting element in the first preferred embodiment according to the invention.

A light emitting element 100 comprises a sapphire substrate 1, a low-temperature grown GaN buffer layer 2, an undoped GaN layer 3, a n-GaN layer 4, a multiquantum well 5 including $In_aGa_{1-a}N$ (well layer)/$In_bGa_{1-b}N$ (barrier layer), a p-$Al_{0.1}Ga_{0.9}N$ layer 6, a p-GaN layer 7 sequentially grown on the sapphire substrate 1. A surface of the p-GaN layer 7 to a part of the n-GaN layer 4 are etched by a reactive ion etching (RIE) apparatus, and a transparent conductive film 8 (Ni with a thickness of 2 nm/Au with a thickness of 4 nm) is deposited on the surface of the p-GaN layer 7 which is not etched by the RIE. Further, a p-electrode 9 is formed on a region of the p-GaN layer 7 which partially overlaps the transparent conductive film 8, and a n-electrode 10 is formed on the surface of the n-GaN layer 4 which is etched by RIE.

Figure 6:
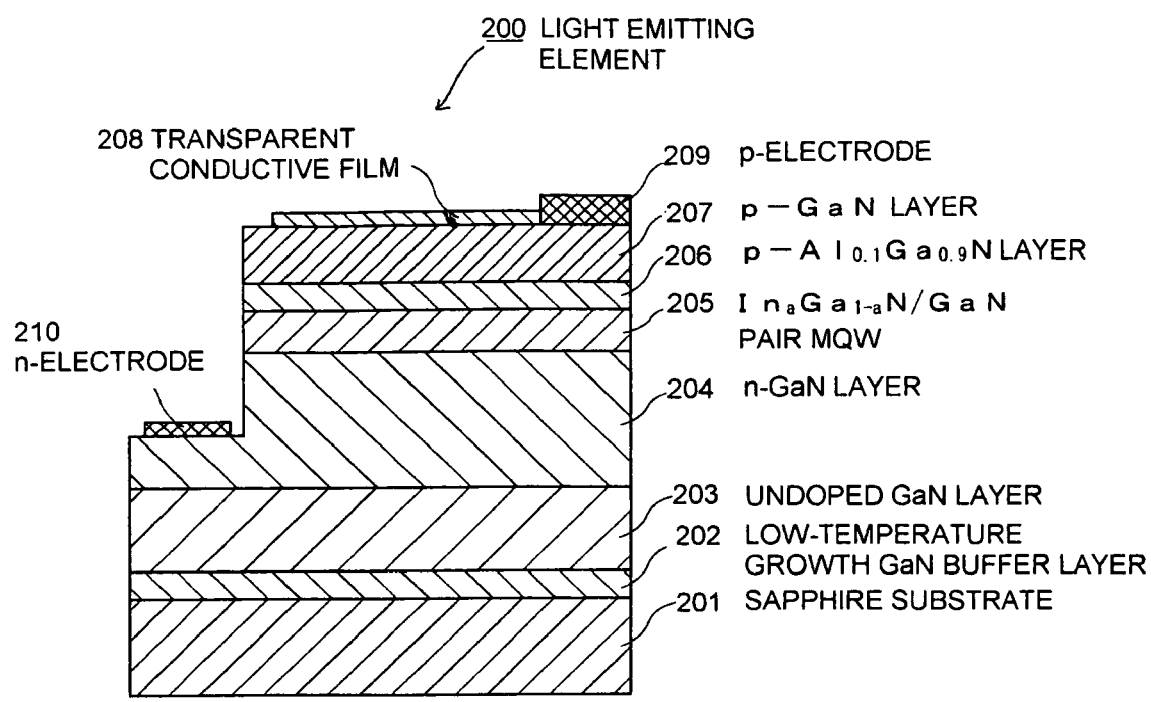
FIG. 6 is a schematic cross sectional view showing a configuration of a conventional nitride semiconductor light emitting element.

Namely, this nitride semiconductor light emitting element 100 is characterized by that $In_aGa_{1-a}N$ (well layer)/GaN (barrier layer) pair multiquantum well 205 of the conventional nitride semiconductor light emitting element 200 shown in FIG. 6 is replaced with the $In_aGa_{1-a}N$ (well layer)/$In_bGa_{1-b}N$ (barrier layer) multiquantum well 5.

In this $In_aGa_{1-a}N$ (well layer)/$In_bGa_{1-b}N$ (barrier layer) multiquantum well 5, an In composition ratio b of the $In_bGa_{1-b}N$ barrier layer may be set within a range of 0.04 to 0.1. According to this structure, as clearly understood from experimental result of the preferred embodiments described later, it is possible to reduce a driving voltage required for an electric current with a current density of 20 A/cm$^2$ to be less than 3V.

Furthermore, a thickness of each of the $In_bGa_{1-b}N$ barrier layer may be set within a range of 5 to 20 nm and a total thickness of the $In_bGa_{1-b}N$ barrier layers may be set to be not greater than 60 nm. According to this structure, the essential function of the nitride semiconductor light emitting element will not be damaged.

The number of the $In_bGa_{1-b}N$ barrier layers can be set arbitrary within a range where a total thickness of the $In_bGa_{1-b}N$ barrier layers is not greater than 60 nm.

In addition, similarly to the conventional device, in the case of a blue light emitting element with a peak wavelength of 460 nm, the In composition ratio a of the $In_aGa_{1-a}N$ well layer may be 0.15. In the case of a green light emitting element with a peak wavelength of 525 nm, the In composition ratio a of the $In_aGa_{1-a}N$ well layer may be 0.25.

Second Preferred Embodiment

Figure 2:
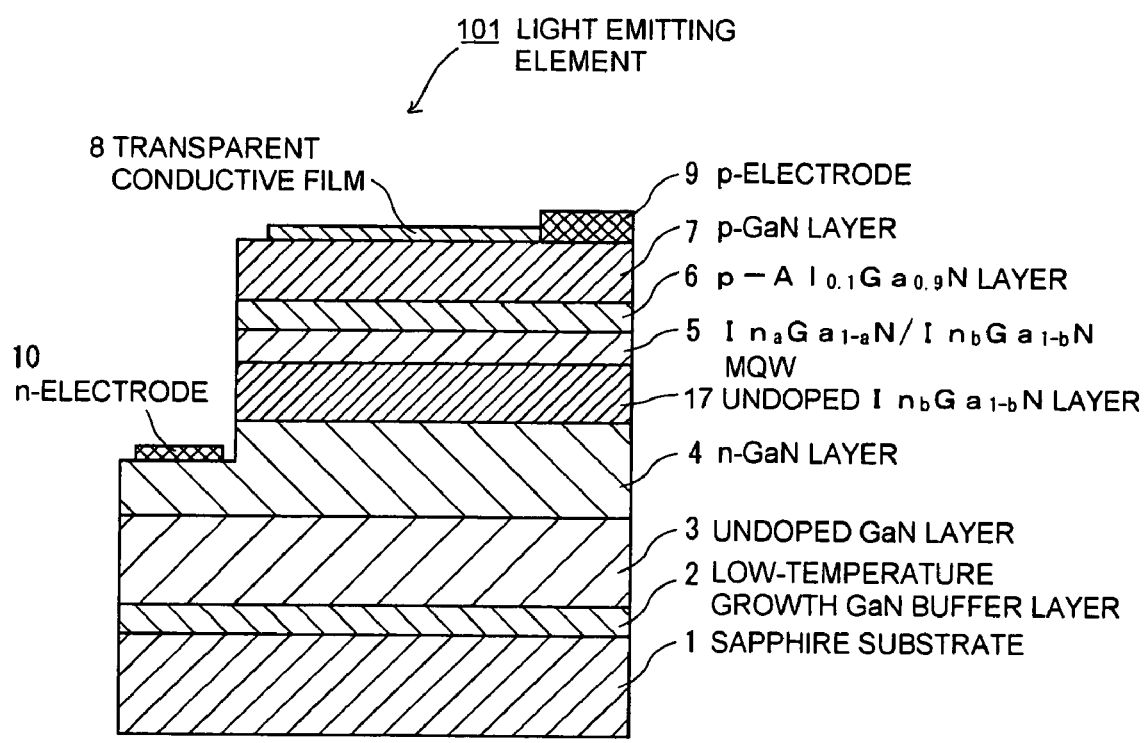
FIG. 2 is a schematic cross sectional view showing a configuration of a nitride semiconductor light emitting element in a second preferred embodiment according to the invention.

FIG. 2 is a schematic cross sectional view showing a configuration of a nitride semiconductor light emitting element in the second preferred embodiment.

A light emitting element 101 comprises a sapphire substrate 1, a low-temperature grown GaN buffer layer 2, an undoped GaN layer 3, a n-GaN layer 4, an undoped $In_bGa_{1-b}N$ layer 17, a multiquantum well 5 including $In_aGa_{1-a}N$ (well layer)/$In_bGa_{1-b}N$ (barrier layer), a p-$Al_{0.1}Ga_{0.9}N$ layer 6, a p-GaN layer 7 sequentially grown on the sapphire substrate 1. A surface of the p-GaN layer 7 to a part of the n-GaN layer 4 are etched by a reactive ion etching (RIE) apparatus, and a transparent conductive film 8 (Ni with a thickness of 2 nm/Au with a thickness of 4 nm) is deposited on the surface of the p-GaN layer 7 which is not etched by the RIE. Further, a p-electrode 9 is formed on a region of the p-GaN layer 7 which partially overlaps the transparent conductive film 8, and a n-electrode 10 is formed on the surface of the n-GaN layer 4 which is etched by RIE.

This nitride semiconductor light emitting element 101 is fabricated similarly to the nitride semiconductor light emitting element 100 in the first embodiment shown in FIG. 1, except the layer configuration in which the undoped $In_bGa_{1-b}N$ layer 17 is interposed between the n-GaN layer 4 and the $In_aGa_{1-a}N/In_bGa_{1-b}N$ multiquantum well 5.

In this nitride semiconductor light emitting element 101, an In composition ratio b of the $In_bGa_{1-b}N$ barrier layer included in the $In_aGa_{1-a}N$ (well layer)/$In_bGa_{1-b}N$ (barrier layer) multiquantum well 5 may be set within a range of 0.04 to 0.1. A thickness of each of the $In_bGa_{1-b}N$ barrier layer may be set within a range of 5 to 20 nm. Further, an In composition ratio b of the undoped $In_bGa_{1-b}N$ layer 17 may be set within a range of 0.04 to 0.1 and a total thickness of the undoped $In_bGa_{1-b}N$ layer 17 and the $In_bGa_{1-b}N$ barrier layers may be set to be not greater than 60 nm.

According to this structure, it is possible to reduce a driving voltage required for an electric current with a current density of 20 A/cm² to be less than 3V. Further, the essential function of the nitride semiconductor light emitting element will not be damaged.

In the second preferred embodiment, the In composition ratio of the undoped $In_bGa_{1-b}N$ layer 17 is determined as b that is identical to the In composition ratio of the barrier layers, in view of lattice matching. However, the In composition ratio of the undoped $In_bGa_{1-b}N$ layer 17 may be a value that is different and independent from the In composition ratio b of the barrier layers, while it is within the range of 0.04 to 0.1.

Further, in the second preferred embodiment, a single layer of the undoped $In_bGa_{1-b}N$ layer 17 is interposed between the n-GaN layer 4 and the $In_aGa_{1-a}N/In_bGa_{1-b}N$ multiquantum well 15. However, the present invention is not limited thereto, and a plurality of InGaN layers may be interposed therebetween, as long as the conditions that the In composition ratio b is within a range of 0.04 to 0.1 and the total thickness of the InGaN layers including the InGaN barrier layers is not greater than 60 nm are satisfied.

Other Embodiments

A light emitting element 102 comprises a GaN substrate 21, a n-GaN layer 4, an undoped $In_bGa_{1-b}N$ layer 17, a multiquantum well 5 including $In_aGa_{1-a}N$ (well layer)/$In_bGa_{1-b}N$ (barrier layer), a p-$Al_{0.1}Ga_{0.9}N$ layer 6, and a p-GaN layer 7 sequentially grown on the GaN substrate 21. A surface of the p-GaN layer 7 to a part of the n-GaN layer 4 are etched by a reactive ion etching (RIE) apparatus, and a transparent conductive film 8 (Ni with a thickness of 2 nm/Au with a thickness of 4 nm) is deposited on the surface of the p-GaN layer 7 which is not etched by the RIE. Further, a p-electrode 9 is formed on a region of the p-GaN layer 7 which partially overlaps the transparent conductive film 8, and a n-electrode 10 is formed on the surface of the n-GaN layer 4 which is etched by RIE.

In the nitride semiconductor light emitting elements in the first and second preferred embodiments, each of a low-temperature growth buffer layer 2, an undoped layer 3 and a n-type layer 4 comprises GaN, however, the present invention is not limited thereto. A part or all of these layers may be composed of $Al_cGa_{1-c}N$ (0<c<0.5).

Further, in the nitride semiconductor light emitting elements in the first and second preferred embodiments, a sapphire substrate 1 is used as a substrate however the present invention is not limited thereto. A $Ga_2O_3$ substrate, a SiC substrate, or a Si substrate may be used.

Furthermore, in place of the low-temperature growth buffer layer 2 in amorphous state, a crystal grown AlN buffer layer may be used.

Figure 3:
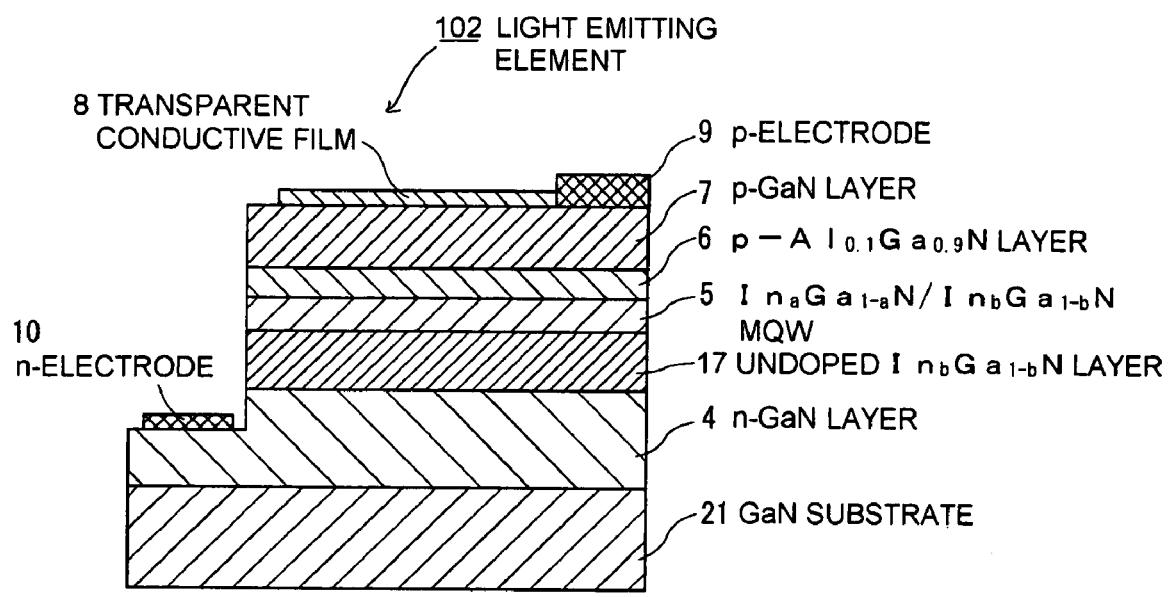
FIG. 3 is a schematic cross sectional view showing a configuration of a nitride semiconductor light emitting element in other preferred embodiments according to the invention.

Further, as shown in FIG. 3, the GaN substrate 21 may be used as a substrate. For this case, the GaN substrate 21 has a same composition as the n-GaN layer 4, so that the problems such as lattice mismatch, difference in thermal expansion coefficients will not occur. Therefore, the low-temperature growth buffer layer 2 as a buffer layer and the undoped GaN layer 3 grown thereon can be omitted as shown in FIG. 3.

EXAMPLES

The present invention will be explained in more detail in the following examples however the present invention is not limited thereto.

Example 1

(Manufacture of a Blue Nitride Semiconductor Light Emitting Element)

By the MOVPE method, a blue (peak wavelength of 460 nm) nitride semiconductor light emitting element 100 having a configuration shown in FIG. 1 is fabricated.

Firstly, a C-plane sapphire substrate 1 with a diameter of 2 inches is introduced into a MOVPE apparatus. Thereafter, a face of the sapphire substrate 1 is cleaned at 1200° C., and a low-temperature growth GaN buffer layer 2 is formed at 520° C. An undoped GaN layer 3 is grown to have a thickness of 2 μm at 1150° C., and a n-GaN layer 4 with a n-type carrier concentration of $5×10^{18}/cm^3$ is grown to have a thickness of 2 μm at the same temperature (1150° C.).

Thereafter, a light emitting layer comprising a multiquantum well 5 including 1 to 10 pairs of $In_aGa_{1-a}N$ quantum well layer (with a thickness of 3 nm)/$In_bGa_{1-b}N$ barrier (0<b<0.13, and a thickness of 3 to 30 nm) is grown at a growth temperature of 780° C. The growth of the multiquantum well 5 is conducted as follows. Firstly, a barrier layer is grown on the n-GaN layer 4 then the well layers and the barrier layers are grown in order of well→barrier→well . . . . A thickness of an uppermost barrier layer (the last barrier layer) is grown to have a thickness of 5 nm. The In composition ratio a of the $In_aGa_{1-a}N$ quantum well layer is 0.15.

Thereafter, a p-$Al_{0.1}Ga_{0.9}N$ layer 6 with a p-type carrier concentration of $3×10^{17}/cm^3$ is grown to have a thickness of 30 nm, and a p-GaN layer 7 a with a p-type carrier concentration of $7×10^{17}/cm^3$ is grown to have a thickness of 170 nm, at a growth temperature of 1100° C.

A part of each wafer surface is successively etched by a reactive ion etching (RIE) apparatus until a part of the n-GaN layer 4 is etched. Thereafter, a transparent conductive film 8 (Ni with a thickness of 2 nm/Au with a thickness of 4 nm) is deposited on a surface of the p-GaN layer 7 which was not etched by the RIE, and is heat-treated at a temperature of 500° C. in an atmosphere of oxygen for 5 minutes to form an ohmic electrode. Thereafter, Ti (with a thickness of 200 nm)/Al (with a thickness of 500 nm)/Ti (with a thickness of 200 nm) is deposited on a region etched by the RIE and heat-treated at a temperature of 600° C. in an atmosphere of nitrogen for 10 minutes to form an ohmic n-electrode 10. Thereafter, Ti (with a thickness of 200 nm)/Au (with a thickness of 8000 nm) is deposited to partially overlap with the transparent conductive film 8 to form a p-electrode 9, and further deposited on the n-electrode 10 to provide a nitride based semiconductor light emitting diode 100 as shown in FIG. 1.

Example 2

(Manufacture of a Green Nitride System Semiconductor Light Emitting Element)

By the MOVPE method, a green (peak wavelength of 525 nm) nitride semiconductor light emitting element 100 having a configuration shown in FIG. 1 is fabricated.

Firstly, a C-plane sapphire substrate 1 with a diameter of 2 inches is introduced into a MOVPE apparatus. Thereafter, a face of the sapphire substrate 1 is cleaned at 1200° C., and a low-temperature growth GaN buffer layer 2 is formed at 520° C. An undoped GaN layer 3 is grown to have a thickness of 2 μm at 1150° C., and a n-GaN layer 4 with a n-type carrier concentration of $5\times10^{18}/cm^3$ is grown to have a thickness of 2 μm at the same temperature (1150° C.).

Thereafter, a light emitting layer comprising a multiquantum well 5 including 1 to 10 pairs of $In_aGa_{1-a}N$ quantum well layer (with a thickness of 3 nm)/$In_bGa_{1-b}N$ barrier (0<b<0.13, and a thickness of 3 to 30 nm) is grown at a growth temperature of 730° C. The growth of the multiquantum well 5 is conducted similarly to the Example 1. Firstly, a barrier layer is grown on the n-GaN layer 4 then the well layers and the barrier layers are grown in order of well→barrier→well . . . . A thickness of an uppermost barrier layer (the last barrier layer) is grown to have a thickness of 5 nm. The In composition ratio a of the $In_aGa_{1-a}N$ quantum well layer is 0.25.

Thereafter, a p-$Al_{0.1}Ga_{0.9}N$ layer 6 with a p-type carrier concentration of $3\times10^{17}/cm^3$ is grown to have a thickness of 30 nm, and a p-GaN layer 7 a with a p-type carrier concentration of $7\times10^{17}/cm^3$ is grown to have a thickness of 170 nm, at a growth temperature of 1100° C.

Similarly to the Example 1, a part of each wafer surface is successively etched by a reactive ion etching (RIE) apparatus until a part of the n-GaN layer 4 is etched. Thereafter, a transparent conductive film 8 (Ni with a thickness of 2 nm/Au with a thickness of 4 nm) is deposited on a surface of the p-GaN layer 7 which was not etched by the RIE, and Ti/Au is deposited to partially overlap with the transparent conductive film 8 to form a p-electrode 9. Thereafter, a n-electrode 10 is formed on a region etched by the RIE to provide a nitride based semiconductor light emitting diode 100 as shown in FIG. 1.

[Experimental Results]

As to the nitride system semiconductor light emitting diodes fabricated in the Examples 1 and 2, the In composition ratio dependency of an InGaN barrier layer with respect to a driving voltage when an electric current with a current density of 20 A/cm² is flown, and the In composition ratio dependency of the InGaN barrier layer with respect to an optical output are evaluated, under the condition where a barrier thickness is 10 nm and the number of MQW pairs is 4. The experimental results are shown in FIGS. 4 and 5, respectively.

Figure 4:
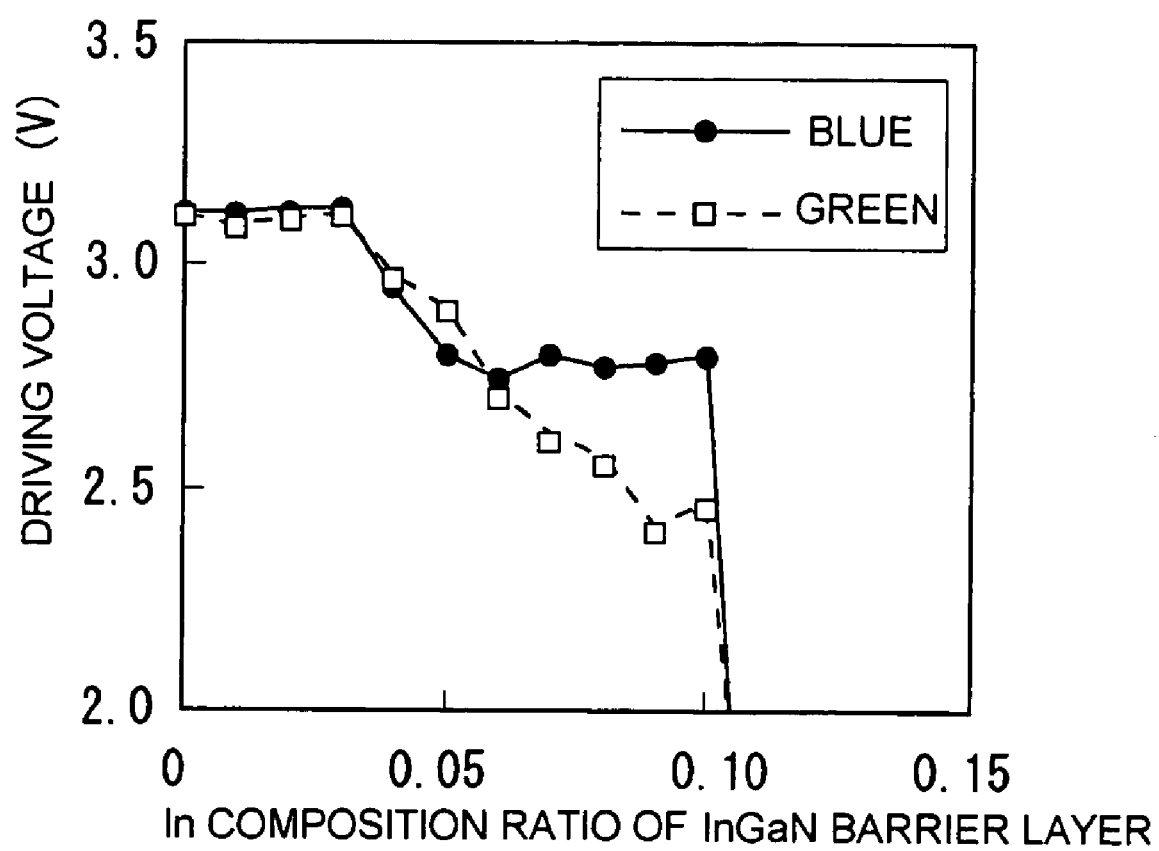
FIG. 4 is a graph showing an In composition ratio dependency of an InGaN barrier layer with respect to a driving voltage when an electric current with a current density of 20 A/cm$^2$ is flown.

It is admitted from the result shown in FIG. 4 that a driving voltage less than 3V can be realized for both of the blue and green lights, when the In composition ratio of the InGaN barrier layer is in the range of 0.04 to 0.1. This driving voltage is lower than that of the conventional light emitting elements (In composition ratio=0).

Figure 5:
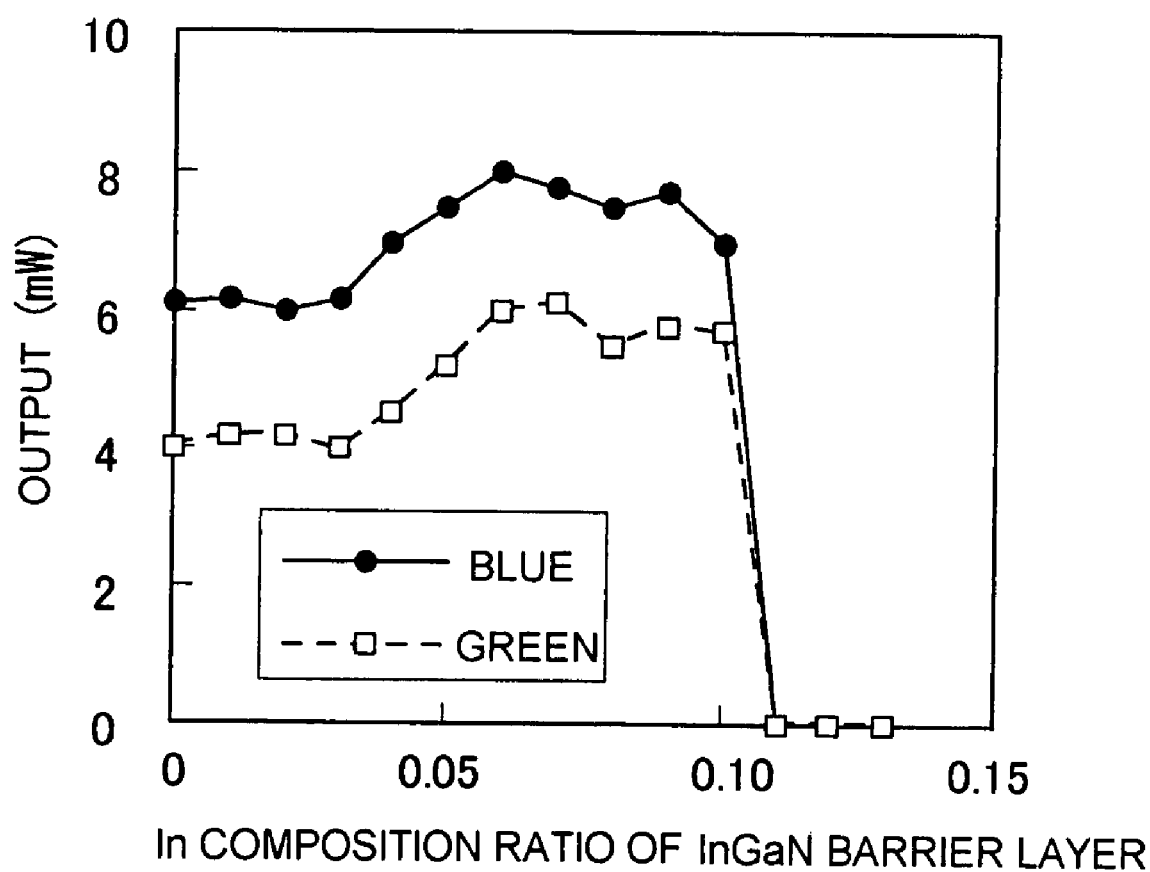
FIG. 5 is a graph showing an In composition ratio dependency of the InGaN barrier layer with respect to an optical output.

Similarly, it is admitted from the result shown in FIG. 5 that a high power light emitting diode can be realized for both of the blue and green lights, when the In composition ratio of the InGaN barrier layer is in the range of 0.04 to 0.1. The optical output is higher than that of the conventional light emitting elements (In composition ratio=0).

On the other hand, when the In composition ratio is greater than 0.1, emission of light is hardly observed for both of the blue and green lights (FIG. 5), and the driving voltage is around 1V (FIG. 4). The cause of the above results is supposed as follows. As the lattice mismatch is increased, lattice defect is introduced, so that a leakage current due to the lattice defect is a dominant current flow mechanism. As a result, recombination of the emission light does not occur at a pn-junction.

Similar evaluation is conducted for various combinations other than the combination of the barrier thickness of 10 nm and the pair number of 4 as described above. As a result, it is demonstrated the driving voltage can be lowered to be less than 3V similarly to the above combination, under the conditions where the In composition ratio of the barrier layer is within the range of 0.04 to 0.1, the thickness of the barrier layer is within the range of 5 to 20 nm, and the total thickness of the barrier layers is not greater than 60 nm.

Example 3

As shown in FIG. 2, a LED in which an undoped $In_bGa_{1-b}N$ layer 17 with a thickness of 1 to 200 nm is interposed between the multiquantum well 5 and the n-GaN layer 4 is fabricated. Then experiment similar to the Examples 1 and 2 is conducted.

As a result, the driving voltage can be lowered to be less than 3V similarly to the Examples 1 and 2, under the conditions where the In composition ratio b of the $In_bGa_{1-b}N$ barrier layer included in the multiquantum well active layer is within the range of 0.04 to 0.1, the thickness of the $In_bGa_{1-b}N$ barrier layer is within the range of 5 to 20 nm, and the total thickness of the barrier layers and the undoped $In_bGa_{1-b}N$ layer 17 with the In composition ratio b of 0.04 to 0.1 is not greater than 60 nm.

On the other hand, although the total thickness of the barrier layers is not greater than 60 nm, when the total thickness of the barrier layers and the undoped $In_bGa_{1-b}N$ layer 16 with the In composition ratio b of 0.04 to 0.1 is greater than 60 nm, the crystal defect is newly introduced, so that the essential function of the light emitting diode is lost.

Example 4

A light emitting diode having a configuration similar to that in the Example 3 in which a growth temperature of the barrier layer is varied in a range of 680 to 800° C., and a peak wavelength of the emission light is within a range of 430 to 560 nm is fabricated.

In the Example 4, the driving voltage can be reduced to be less than 3V (lower than that of the conventional device) similarly to the Example 3, under the conditions where the In composition ratio b of the $In_bGa_{1-b}N$ barrier layer included in the multiquantum well active layer is within the range of 0.04 to 0.1, the thickness of the $In_bGa_{1-b}N$ barrier layer is within the range of 5 to 20 nm, and the total thickness of the barrier layers and the undoped $In_bGa_{1-b}N$ layer 17 with the In composition ratio b of 0.04 to 0.1 is not greater than 60 nm.

Example 5

A light emitting diode having a configuration similar to that in the Example 3 in which each of a low-temperature growth buffer layer and n-type layer comprises $Al_cGa_{1-c}N$ (0<c<0.5) is fabricated.

In the Example 5, result similar to the Example 3 can be obtained.

Example 6

A light emitting diode having a configuration similar to that in the Example 3 in which an AlN layer grown at a temperature of 1100° C. to have a thickness of 1 µm is used as a buffer layer in place of the low-temperature growth buffer layer is fabricated.

In the Example 6, result similar to the Example 3 can be obtained.

Example 7

A light emitting diode having a configuration similar to that in the Example 3 in which a substrate comprises SiC and an AlN layer grown at a temperature of 1100° C. to have a thickness of 100 nm is used as a buffer layer is fabricated.

In the Example 7, result similar to the Example 3 can be obtained.

Example 8

A light emitting diode having a configuration similar to that in the Example 3 in which a substrate comprises Si and an AlN layer grown at a temperature of 1100° C. to have a thickness of 100 nm is used as a buffer layer is fabricated.

In the Example 8, result similar to the Example 3 can be obtained.

Example 9

A light emitting diode having a configuration similar to that in the Example 3 in which a substrate comprises GaN and a n-type GaN layer is directly grown the GaN substrate is fabricated.

In the Example 9, result similar to the Example 3 can be obtained.

Example 10

A light emitting diode having a configuration similar to that in the Example 3 in which a substrate comprises AlN and a n-type GaN layer is directly grown the AlN substrate is fabricated.

In the Example 10, result similar to the Example 3 can be obtained.

Example 11

A light emitting diode having a configuration similar to that in the Example 3 in which a substrate comprises $Ga_2O_3$ and a n-type GaN layer is directly grown the $Ga_2O_3$ substrate is fabricated.

In the Example 11, result similar to the Example 3 can be obtained.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A nitride semiconductor light emitting element, comprising:
    a substrate; and
    an n-type GaN layer, an undoped InGaN layer, a multiquantum well active layer comprising a lowest InGaN barrier layer and a plurality of pairs of InGaN well/InGaN barrier layers, and a p-type layer adjoining the multiquantum well active layer, laminated on the substrate in this order from the substrate,
    wherein only the undoped InGaN layer is interposed as a semiconductor layer between the n-type GaN layer and the multiquantum well active layer, the undoped InGaN layer having an In composition ratio in a range of 0.04 to 0.1,
    wherein a composition of the InGaN barrier layers of the multiquantum well active layer is expressed by $In_xGa_{1-x}N$ (0.04×0.1), and a total thickness of the InGaN layers having an In composition ratio in a range of 0.04 to 0.1 in the light emitting element including the InGaN barrier layers is not greater than 60 nm,
    wherein the In composition ratio of the undoped InGaN layer is identical to an In composition ratio of the InGaN barrier layers, and
    wherein a thickness of each of the InGaN barrier layers is in a range of 5 to 20 nm.

2. The nitride semiconductor light emitting element, according to claim 1, wherein:
    an emission light peak wavelength of the multiquantum well active layer is in a range of 430 to 560 nm.

3. The nitride semiconductor light emitting element, according to claim 1, wherein:
    the multiquantum well active layer is formed on a GaN layer or an $Al_yGa_{1-y}N$ layer (0<y<0.5) that is formed on the substrate.

4. The nitride semiconductor light emitting element, according to claim 1, further comprising:
    a buffer layer provided on the substrate, the buffer layer comprising one of AlN and $Al_cGa_{1-c}N$ (0<c<0.5),
    wherein the substrate comprises a single crystal substrate comprising one material selected from the group consisting of sapphire, $Ga_2O_3$, SiC, Si, and AlN.

5. The nitride semiconductor light emitting element, according to claim 2, wherein:
    a driving voltage required for an electric current with a current density of 20 A/cm$^2$ is less than 3V.

6. The nitride semiconductor light emitting element, according to claim 1, wherein:
    a thickness of an uppermost InGaN barrier layer is 5 nm.

7. The nitride semiconductor light emitting element, according to claim 1, further comprising:
    an undoped GaN layer between the n-type GaN layer and the substrate; and
    a crystal-grown AlN buffer layer interposed between the substrate and the undoped GaN layer.

8. A nitride semiconductor light emitting element, comprising:
    a substrate; and
    an undoped GaN layer, an n-type GaN layer, an undoped InGaN layer, a multiquantum well active layer comprising a lowest InGaN baffler layer and a plurality of pairs of InGaN well/InGaN barrier layers, and
    a p-type layer, adjoining the multiquantum well active layer, laminated on the substrate in this order from the substrate,
    wherein only the undoped InGaN layer is interposed as a semiconductor layer between the n-type GaN layer and the multiquantum well active layer, the undoped InGaN layer having an In composition ratio in a range of 0.04 to 0.1,
    wherein a crystal-grown AlN buffer layer is interposed between the substrate and the undoped GaN layer,
    wherein a composition of the InGaN barrier layers of the multiquantum well active layer is expressed by $In_xGa_{1-x}N$ (0.04×0.1), and a total thickness of the InGaN layers having an In composition ratio in a range of 0.04 to 0.1 in the light emitting element including the InGaN baffler layers is not greater than 60 nm, wherein the In composition ratio of the undoped InGaN layer is identical to an In composition ratio of the InGaN barrier layers, and wherein a thickness of each of the InGaN barrier layers is in a range of 5 to 20 nm.

9. The nitride semiconductor light emitting element, according to claim 8, wherein:

an emission light peak wavelength of the multiquantum well active layer is in a range of 430 to 560 nm.

10. The nitride semiconductor light emitting element, according to claim 8, wherein:

the multiquantum well active layer is formed on a GaN layer or an $Al_yGa_{1-y}N$ layer (0<y<0.5) that is formed on the substrate.

11. The nitride semiconductor light emitting element, according to claim 8, wherein:

the substrate comprises a single crystal substrate comprising one material selected from a group consisting of sapphire, $Ga_2O_3$, SiC, Si, GaN, and AlN.

12. The nitride semiconductor light emitting element, according to claim 9, wherein:

a driving voltage required for an electric current with a current density of $20A/cm^2$ is less than 3V.

13. The nitride semiconductor light emitting element, according to claim 8, wherein:

a thickness of an uppermost InGaN barrier layer is 5 nm.

14. The nitride semiconductor light emitting element, according to claim 1, wherein an In composition ratio of the InGaN barrier layer is 0.06 to 0.1.

15. The nitride semiconductor light emitting element, according to claim 8, wherein an In composition ratio of the InGaN barrier layer is 0.06 to 0.1.

16. A nitride semiconductor light emitting element, comprising:

an n-type GaN layer formed on a substrate;

an undoped InGaN layer adjoining the n-type GaN layer, the InGaN layer having an In composition ratio in a range of 0.04 to 0.1;

a multiquantum well active layer adjoining the undoped InGaN layer, the multiquantum layer comprising a lowest InGaN barrier layer and a plurality of pairs of InGaN well/InGaN barrier layers, a composition of the InGaN baffler layers of the multiquantum well active layer being expressed by $In_xGa_{1-x}N$ (0.04×0.1), a total thickness of the InGaN layers comprising an In composition ratio in a range of 0.04 to 0.1, including the InGaN barrier layers, being not greater than 60 nm; and a p-type layer adjoining the multiquantum well active layer, wherein the In composition ratio of the undoped InGaN layer is identical to an In composition ratio of the InGaN barrier layers, and wherein a thickness of each of the InGaN barrier layers is in a range of 5 to 20 nm.

* * * * *